United States Patent
Wu

(10) Patent No.: US 6,285,238 B1
(45) Date of Patent: Sep. 4, 2001

(54) ELECTRICALLY PROGRAMMABLE FUSE

(75) Inventor: Shu-Fang Wu, Taipei (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/621,374

(22) Filed: Jul. 21, 2000

Related U.S. Application Data

(62) Division of application No. 09/080,115, filed on May 18, 1998, now Pat. No. 6,100,746.

(51) Int. Cl.$^7$ ................................................. H01H 85/00
(52) U.S. Cl. ............................................ 327/525; 327/534
(58) Field of Search ................................ 257/239, 311; 327/525, 534; 365/185.01, 185.14, 185.18, 185.27, 185.28

(56) References Cited

U.S. PATENT DOCUMENTS

| | | |
|---|---|---|
| 4,852,044 | 7/1989 | Turner et al. ........................ 364/900 |
| 5,233,566 | 8/1993 | Imamiya et al. ................. 365/230.08 |
| 5,258,947 | 11/1993 | Sourgen .................................. 365/96 |
| 5,465,231 * | 11/1995 | Ohsaki ............................ 365/185.33 |
| 5,642,316 | 6/1997 | Tran et al. ........................... 365/200 |
| 5,719,427 * | 2/1998 | Tong et al. ........................... 257/355 |
| 5,898,614 * | 4/1999 | Takeuchi ........................... 365/185.1 |
| 5,912,937 * | 6/1999 | Goetting et al. ........................ 377/67 |
| 6,100,560 * | 8/2000 | Lovett .................................. 257/315 |

OTHER PUBLICATIONS

Wolf, "Silicon Processing For The VLSI Era" vol. 2, Sunset Beach CA, Lattice Press, 1990, p 624–5.

* cited by examiner

Primary Examiner—Jeffrey Zweizig
(74) Attorney, Agent, or Firm—George O. Saile; Stephen B. Ackerman

(57) ABSTRACT

In this invention is described an electrically programmable fuse that uses a floating gate to control the fuse action. The activation of the fuse can be done at any time during the life of the product containing the fuse. By programming a charge onto the floating gate an active transistor is made to conduct or not to conduct. The fuse can be reused by re-programming the fuse to the previous state. Different states of the fuse which represent product options can be obtained by programming appropriate voltage levels.

5 Claims, 3 Drawing Sheets

ELECTRICALLY PROGRAMMABLE FUSE

This is a division of patent application Ser. No. 09/080,115, filing date May 18, 1998, now U.S. Pat. No. 6,100,746, An Electrically Programmable Fuse, assigned to the same assignee as the present invention.

BACKGROUND OF THE INVENTION

1. Field of Invention

This invention is related to integrated circuits and more particularly electrically programmable fuse devices.

2. Description of Related Art

A fuse device used on an integrated circuit is for the purpose of repairing a defect or selecting a functional option. The operation of using a fuse has required the use of a laser to vaporize a thin piece of poly-silicon that made up the fuse. This requires the fuse to be opened by the laser before final packaging of the semiconductor, and once the fuse is opened there is no recovery to the original state. With this limitation there has been a push to find ways to avoid the limitations of a fuse requiring a laser to break the connection.

In U.S. Pat. No. 5,642,316 (Tran et al.) a source follower EEPROM memory fuse is used to program memory redundancy circuits for repair of defective memory rows. The redundant memory circuits are initially outside the normal memory address range and through the use of fuses are brought into the normal memory address range to replace defective memory bits. This EEPROM fuse can be reused many times. In U.S. Pat. No. 5,258,947 (Sourgen) EEPROM cells are used in a regular memory state and can be programmed to perform the function of a fuse. The fuse function results from the breakdown of the tunnel oxide and places the memory cell into an irreversible state. In U.S. Pat. No. 5,233,566 (Imamiya et al.) a floating-gate, avalanche injected, MOS transistor (FAMOS) memory cell is connected in series with a fuse to provide a redundant memory cell. In U.S. Pat. No. 4,852,044 (Turner et al.) is described a security fuse device for a programmed logic device (PLD) that uses charge stored on a floating gate of a transistor to prevent access to the PLD architectural data.

In reference to "Silicon Processing for the VLSI Era" by Stanley Wolf Ph.D., Lattice Press 1990, pp 624–625, a floating-gate avalanche-injection MOS transistor (FAMOS) device is described in which charge is injected into a gate from hot electrons produced by avalanche breakdown of the drain-substrate pn junction. Once the electrons are transferred to the gate they are trapped there because of the potential energy barrier at the oxide-silicon interface.

A fuse like device that can be programmed to be on or off after packaging and hold its switching state for years can be a very useful tool. Not only can it be used for the classical repair of memories but it can also be used to activate or deactivate function and features of a particular circuit. These functions and features being changed at the command of the user provides additional flexibility without requiring factory intervention. Also being able to reverse a decision to chose a function can be very valuable particularly when problems arise.

SUMMARY OF THE INVENTION

This invention is an electronic rise like device that is made up of two semiconductor devices connected by a floating gate. In a first embodiment a first of the two transistors is a P-channel device seated in an N-well on a P-substrate that provides the activation and de-activation of the electronic fuse. A second transistor connected to the floating gate is an N-channel transistor which is on or off depending upon the charge on the floating gate and provides a fuse like function.

Charge is programmed onto the floating gate by means of hot electrons or Fowler-Nordheim tunneling in the first transistor to enable the second transistor to be on and act as a non-blown fuse. Charge is remove from the floating gate using Fowler-Nordheim tunneling, turning off the second transistor, and enabling the second transistor to act as an open fuse.

In a second embodiment of this invention, a heavily doped P+ region is implanted around one end of a floating gate in an N well residing on a P substrate. At the other end of the floating gate is an N-channel transistor in the P-substrate. The heavily doped P+ region provides the means for programming charge onto the floating gate using either Fowler-Nordheim tunneling or hot electrons, and the N-channel transistor is either on or off depending upon the charge on the floating gate. Charge is removed from the floating gate using Fowler-Nordheim tunneling.

In a variation of the second embodiment of this invention an N+ device formed by a heavily doped N+ region is implanted around one end of a floating gate in a P well residing in an N well on a P substrate. The other end of the floating gate is an N-channel transistor in the P well residing in an N well on the P substrate. The N+ device provides the means for programming charge onto the floating gate using either hot electrons or Fowler-Nordheim tunneling, and the N-channel transistor is either on or off depending upon the charge on the floating gate. Charge is removed from the floating gate using Fowler-Nordheim tunneling.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
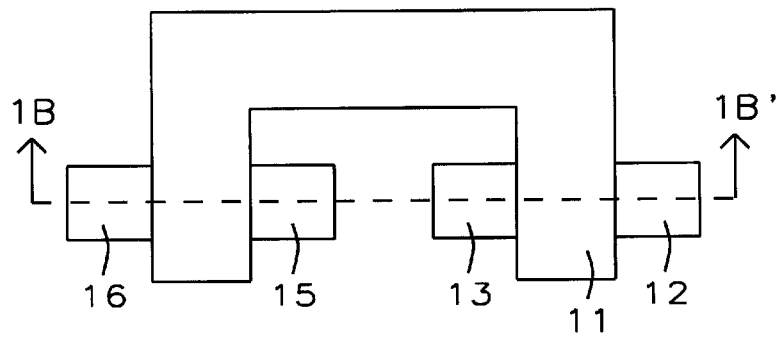
FIG. 1a is a plan view of the electrically programmable fuse device.
Figure 1B:
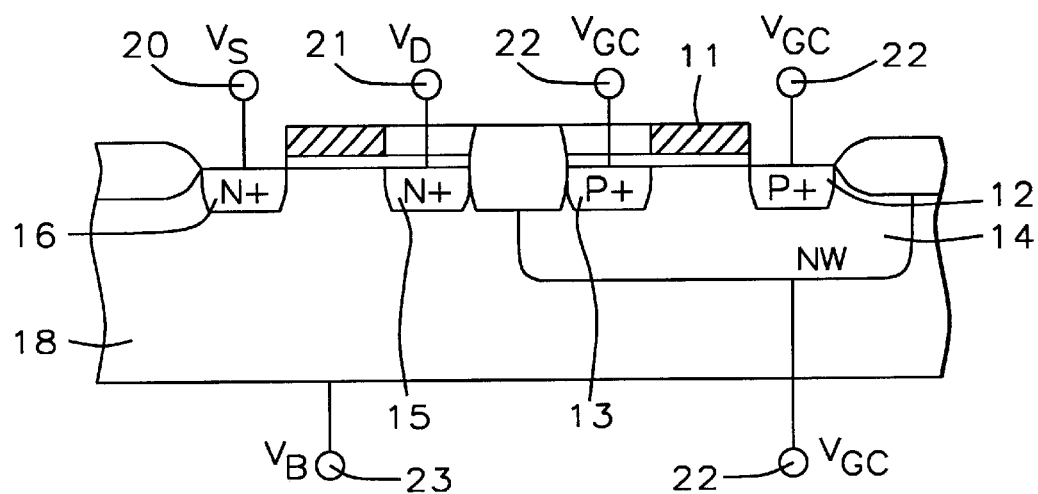
FIG. 1b is the vertical structure of the electrically programmable fuse device.

Referring to FIG. 1a, a plan view of the electrically programmable fuse is shown. For convenience of illustration and relationship to the cross section in FIG. 1b, a floating gate 11 connecting an N-channel and a P-channel device is shown as "U" shaped; however, the floating gate can be any shape that is commensurate with the layout requirements. The floating gate 11 connects two transistors, a P-channel transistor with a drain 12 and source 13 and an N-channel transistor with drain 16 and source 15. A cross section view AA is shown in FIG. 1b. The P-channel transistor is constructed of P+ diffusions for a drain 12 and source 13 which reside in an N-well 14. The N-channel transistor on the opposite end of the floating gate 11 and has an N+ source 16 and an N+ drain 15 that reside in the P substrate 18.

Continuing to refer to FIG. 1b, a gate control voltage $V_{GC}$ 22, connected to the N well 14, the P+ drain 12 and the P+ source 13, programs the electrically programmable fuse. A voltage Vs 20 is connected to the source 16 of the N-channel transistor and a voltage $V_D$ 21 is connected to the drain 15 N-channel transistor. A voltage $V_B$ 23 is connected to the semiconductor substrate 18. Programming charge onto the floating gate 11 is done by means of hot electrons or Fowler-Nordheim tunneling when a high positive voltage is applied to $V_{GC}$ 22. For example, when programming the fuse to be on (conducting) using hot electrons, $V_{GC}$=approximately +6 to +7 volts, $V_B$=$V_S$=0 volts, and $V_D$=approximately +5 to +7 volts. When programming the electronic fuse to be on using the Fowler-Nordheim tunneling mechanism, $V_{GC}$= approximately +8 to +10 volts, $V_D$=$V_S$=+3.5 volts and $V_B$=0 volts. In order to erase the charge on the floating gate 11 and turn off (non-conducting) the electrically programmable fuse, Fowler-Nordheim tunneling is used with a high negative voltage being applied to $V_{GC}$ 22, for example $V_{GC}$= approximately −6 to −10 volts, $V_S$=+5 volts and $V_D$ is floating. To read the N-channel transistor and use it as a fuse which is blown or not blown, the following circuit voltages need to be applied, $V_{GC}$=+5 volts, $V_D$=+1.5 volts and $V_S$=$V_B$=0 volts.

Figure 2A:
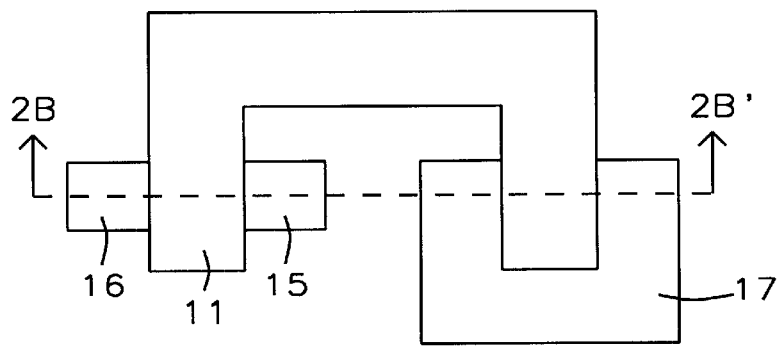
FIG. 2a is a plan view of a second embodiment of the electrically programmable fuse device.

In FIG. 2a is shown a plan view of a second embodiment of the electrically programmable switch. A "U" shaped floating gate 11 is used for illustrative purposes and can be any shape commensurate with the layout requirements. At one end of the floating gate 11 is P+ diffusion 17 and at the other end of the floating gate is an N-channel transistor having a drain 16 and a source 15. A cross section view BB is shown in FIG. 2b where the P+ diffusion 17 is shown within an N-well 14, and the N+ drain 16 and the N+ source 15 of the N-channel transistor are shown residing in the P substrate 18.

Figure 2B:
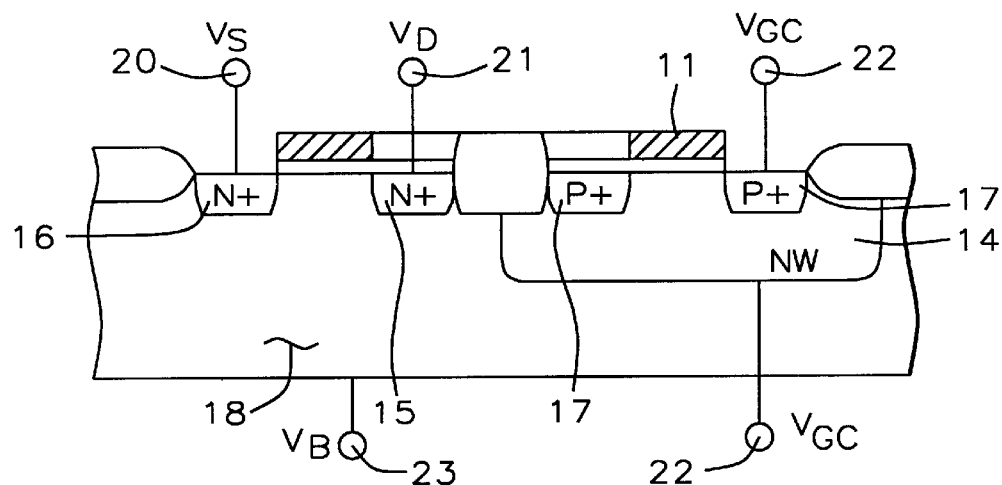
FIG. 2b is the vertical stricture of a second embodiment of tie electrically programmable fuse device.

Continuing to refer to FIG. 2b, a gate control voltage $V_{GC}$ 22 is connected to the P+ diffusion 17 and the N well. Connected to the source 16 of the N-channel transistor is $V_S$ 20 and connected to the drain 15 is the voltage $V_D$ 21. A voltage $V_B$ 23 is connected to the semiconductor substrate 18. Programming of the charge on the floating gate 11 is done by means of hot electrons or Fowler-Nordheim tunneling when a high positive voltage is applied to $V_{GC}$ 22. For example, when programming the fuse to be on (conducting) using hot electrons, $V_{GC}$=approximately +6 to +7 volts, $V_B$=$V_S$=0 volts, and VD=approximately +5 to +7 volts; and when programming the electronic fuse to be on using the Fowler-Nordheim tunneling mechanism, $V_{GC}$= approximately +8 to +10 volts, $V_D$=$V_S$=+3.5 volts and $V_B$=0 volts. In order to erase the charge on the floating gate 11 and turn off (non-conducting) the electrically programmable fuse, Fowler-Nordheim tunneling is used with a high negative voltage being applied to $V_{GC}$ 22, for example $V_{GC}$= approximately −6 to −10 volts, $V_S$=+5 volts and $V_D$ is floating. To read the N-channel transistor and use it as a fuse which is blown or not blown, the following circuit voltages need to be applied, $V_{GC}$=+5 volts, $V_D$=+1.5 volts and $V_S$=$V_B$=0 volts.

Figure 2C:
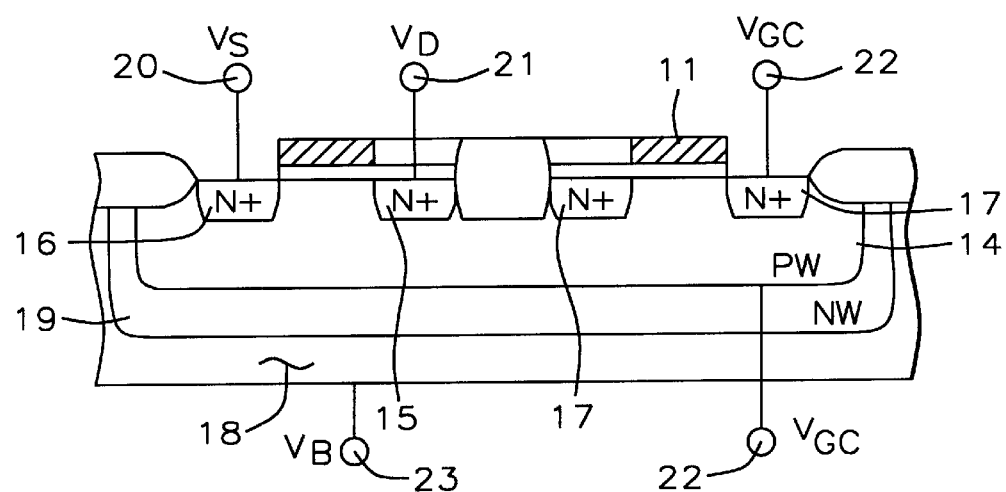
FIG. 2c is the vertical structure of a variation of the second embodiment of the electrically programmable fuse device.

In FIG. 2c is a cross section of a variation of the second embodiment of this invention. An N+ diffusion 17 is located at one end of a floating gate 11 in a P well 14. The other end of the floating gate forms a transistor with an N+ source 16 and an N+ drain 21 and residing in the P well 14. The P well 14 resides inside an N well 19 on a P substrate 18. A voltage $V_{GC}$ 22 connects to the P well 14 and the N+ diffusion 17, and a voltage $V_B$ 23 is connected to the semiconductor substrate 18. Connected to the source 16 of the N-channel transistor is a voltage $V_S$ 20, and connected to the drain 15 is a voltage $V_D$ 21.

Continuing to refer to FIG. 2c, programming of the charge on the floating gate 11 is done by means of hot electrons or Fowler-Nordheim tunneling when a high positive voltage is applied to $V_{GC}$ 22. For example, when programming the fuse to be on (conducting) using hot electrons, $V_{GC}$= approximately +6 to +7 volts, $V_B$=$V_S$=0 volts, and VD=approximately +5 to +7 volts; and when programming the electronic fuse to be on using the Fowler-Nordheim tunneling mechanism, $V_{GC}$=approximately +8 to +10 volts, $V_D$=$V_S$=+3.5 volts and $V_B$=0 volts. In order to erase the charge on the floating gate 11 and turn off (non-conducting) the electrically programmable fuse, Fowler-Nordheim tunneling is used with a high negative voltage being applied to $V_S$ 20 and $V_D$ 21, for example $V_{GC}$=0 volts and $V_S$=$V_D$= approximately +8 to +10 volts. To read the N-channel transistor and use it as a fuse which is blown or not blown, the following circuit voltages need to be applied, $V_{GC}$=+5 volts, $V_D$=+1.5 volts and $V_S$=$V_B$=0 volts.

Figure 3A:
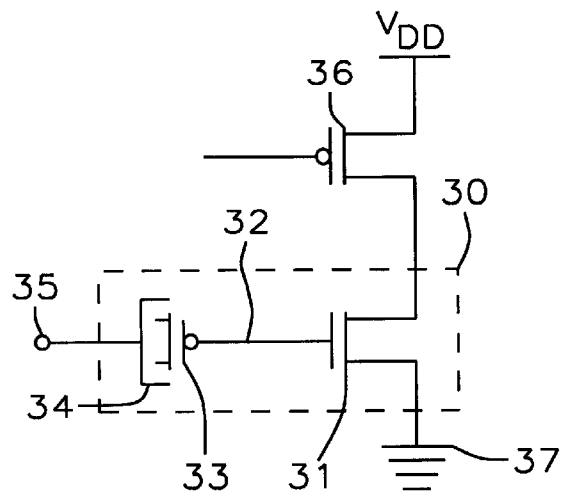
FIG. 3a shows a schematic of a possible usage of the fuse device.

Shown in FIG. 3a is a possible circuit configuration for the electrically programmable fuse 30. The N-channel transistor 31 of the fuse 30 is connected between ground 37 and other circuitry represented by a P-channel transistor 36 connected to $V_{DD}$. The gate 32 of the N channel transistor 31 of the fuse 30 is a floating gate connected to the gate of the P-channel transistor 33 which is also floating. The N-well of the P-channel transistor 34 is connected to (a electrical terminal 35 to provide capability to set the fuse 30 into different modes which include "on", "off" and higher threshold voltages. The source and drain of the P-channel transistor 33 can also be used to program the state of the fuse and can be connected to other circuitry to turn the fuse on and off.

Figure 3B:
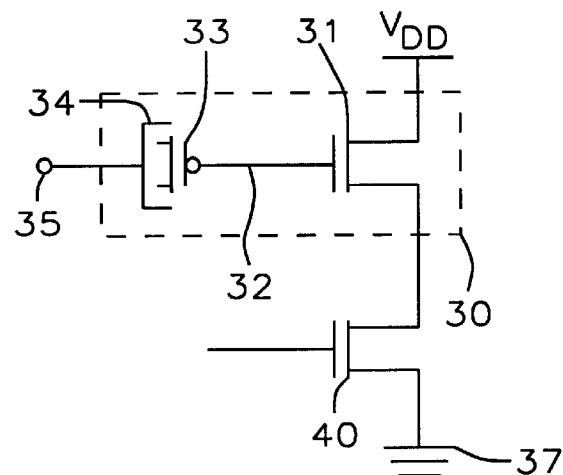
FIG. 3b shows an additional schematic of a possible usage of the fuse device.

In FIG. 3b is shown a possible connection of the electrically programmable fuse 30 with an N-channel transistor 40 representing other circuitry connected to ground 37. The N-channel transistor 31 of the electrically programmable fuse 30 is connected to a P+ device 33 by means of the floating gate 32. The N-well of die P-channel transistor 34 is connected to an electrical terminal 35 to provide capability to set the fuse 30 into different modes which include "on", "off" and higher threshold voltages. The source and drain of tie P-channel transistor 33 can also be used to program the state of the fuse and can be connected to other circuitry to turn the fuse on and off.

Figure 4:
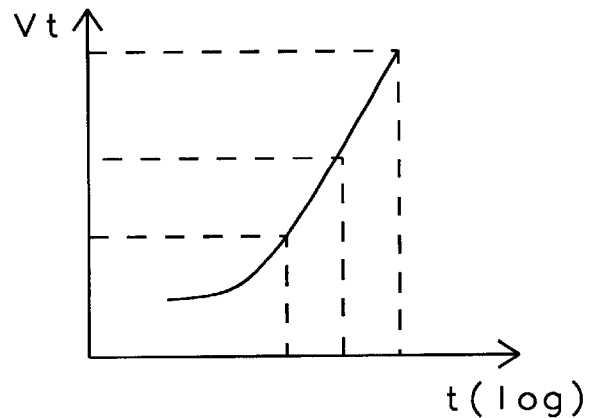
FIG. 4 is a diagram of device threshold, Vt, versus time the fuse is being programmed.

In FIG. 4 is shown the relationship between the level of the threshold voltage Vt and lie time (logarithmic scale) required during programming of charge on the floating gate. Depending upon the user's requirements different voltages can be used to set the state of the fuse. For example, Vt=2.0 volts for operation in a 2.5 volt circuit, Vt=4 volts for operation in a 3 volt circuit and Vt=6 volts for operation in a 5 volt circuit.

While the invention has been particularly shown and described with reference to preferred embodiments thereof, it will be understood by those skilled in the art that various changes in form and details may be made without departing from the spirit and scope of the invention.

What is claimed is:

1. A programmable electronic fuse, comprising:
   a) a floating gate connecting a transistor to a semiconductor device,
   b) said semiconductor device comprising a P+ diffusion in an N well,
   c) said transistor an N-channel device,
   d) said transistor being on or off depending upon a charge on the floating gate,
   e) said fuse programmable by changing the charge on the floating gate induced by a voltage applied to said N well and said P+ diffusion.

2. The programmable electronic fuse of claim 1, wherein the P+ diffusion surrounds one end of the floating gate.

3. The programmable electronic fuse of claim 1, wherein the fuse is an electronic switch that is controlled to be open and closed by the charge induced on said floating gate.

4. The programmable electronic fuse of claim 1, wherein the fuse has an on mode and off mode wherein said fuse can be switched from said on mode to said off mode and from said off mode to said on mode.

5. The programmable electronic fuse of claim 1, wherein the fuse is turned off when both the P+ diffusion and the N-well located at one end of the floating gate are connected to $V_{GC}$ that is equal to approximately around −6 to −10 volts.

* * * * *